United States Patent
Kitamura (10) Patent No.: US 6,559,498 B2
(45) Date of Patent: *May 6, 2003

(54) SEMICONDUCTOR DEVICE AND METHOD OF FORMING THE SAME

(75) Inventor: Hiroyuki Kitamura, Tokyo (JP)

(73) Assignee: NEC Electronics Corporation, Kanagawa (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/466,186

(22) Filed: Dec. 17, 1999

(65) Prior Publication Data

US 2002/0064915 A1 May 30, 2002

(30) Foreign Application Priority Data

Dec. 17, 1998 (JP) .............................. 10-359188

(51) Int. Cl.$^7$ ............................................. H01L 27/108
(52) U.S. Cl. .................... 257/309; 257/306; 257/296
(58) Field of Search ................................ 257/306–309, 257/68–71, 296–313, 905–908; 438/255, 253–256, 396–398, 665, 964

(56) References Cited

U.S. PATENT DOCUMENTS

| 5,612,558 | A | * | 3/1997 | Harshfield | 257/298 |
| 5,770,500 | A | * | 6/1998 | Batra et al. | 438/255 |
| 5,827,766 | A | * | 10/1998 | Lou | 438/253 |
| 5,831,282 | A | * | 11/1998 | Nuttall | 257/64 |
| 5,923,973 | A | * | 7/1999 | Chen et al. | 438/255 |
| 5,956,587 | A | * | 9/1999 | Chen et al. | 438/255 |
| 5,959,326 | A | * | 9/1999 | Aiso et al. | 257/306 |
| 6,046,083 | A | * | 4/2000 | Lin et al. | 438/255 |

FOREIGN PATENT DOCUMENTS

| JP | 7-202023 | * | 8/1995 | ....... H01L/21/8242 |
| JP | 200036575 | | 2/2000 | |
| JP | 2000156476 | | 6/2000 | |
| KR | B1 1995-0000655 | | 1/1995 | |

* cited by examiner

Primary Examiner—Tom Thomas
Assistant Examiner—Ori Nadav
(74) Attorney, Agent, or Firm—Young & Thompson (57) ABSTRACT

The present invention provides a cylindrically shaped stack electrode having a lamination structure which comprises a cylindrically shaped outer layer and a cylindrically shaped inner layer laminated on an inner wall of said cylindrically shaped outer layer, wherein hemispherical grains are formed on an inner wall of said cylindrically shaped inner layer. The cylindrically shaped stack electrode has the lamination structure of a plurality of layers.

10 Claims, 9 Drawing Sheets

SEMICONDUCTOR DEVICE AND METHOD OF FORMING THE SAME

BACKGROUND OF THE INVENTION

The present invention relates to a semiconductor device and a method of forming the same, and more particularly to a semiconductor device having a cylindrically shaped capacitor with an improved electrode surface, and method of forming the same.

As an electrode of the capacitor in the semiconductor device, a box-shaped electrode has been known. A hemispherical grain surface is formed on a surface of the box-shaped electrode to increase a surface area of the box-shaped electrode thereby increasing a capacitance of the capacitor. It is, however, difficult to obtain a sufficient capacitance of the capacitor under the requirement for further scaling down of the semiconductor device. Under this circumstances, in place of the conventional capacitor having the box-shaped electrode, a cylindrically shaped electrode has been attracted which has a hemispherical grain surface entirely which is larger by about four times than the box-shaped stacked electrode. In Japanese laid-open patent publication No. 9-167833, it is disclosed to form a hemispherical grain surface on the entire surface of the cylindrically shaped electrode.

Formation of the hemispherical grain is progressed from both outer and inner surfaces of the cylindrically shaped electrode. In order to enlarge a grain size, it is possible that holes are grown from the outer wall toward the inner wall of the cylindrically shaped electrode, whereby the holes may penetrate the cylindrically shaped electrode. Even if the penetrating holes are not formed, it is possible that crystal grains of polysilicon penetrate from the inner wall to the outer wall of the cylindrically shaped electrode.

The above phenomenons of penetrations of the holes or the crystal grains result in reductions in mechanical strength of the stacked electrode. When a dielectric film is formed on the surface of the stacked electrode, and when an inter-layer insulator is formed, and when a heat treatment is carried out, stresses are applied to the stacked electrode, whereby it is possible that the capacitor is broken. If the hemispherical grains are formed on the outer wall of the cylindrically shaped electrode, then it may be possible that a short circuit is formed between adjacent two of the stacked electrodes.

In the above circumstances, it had been required to develop a novel semiconductor device and method of forming the same free from the above problems.

SUMMARY OF THE INVENTION

Accordingly, it is an object of the present invention to provide a novel cylindrically shaped stacked electrode free from the above problems.

It is a further object of the present invention to provide a novel cylindrically shaped stacked electrode having a hemispherical grain surface being free of any holes which penetrate from an outer wall to an inner wall of the cylindrically shaped stacked electrode and having a high mechanical strength to prevent a capacitor from being broken.

It is a still further object of the present invention to provide a novel cylindrically shaped stacked electrode having a hemispherical grain surface being free of any crystal grains which penetrate from an outer wall to an inner wall of the cylindrically shaped stacked electrode and having a high mechanical strength to prevent a capacitor from being broken.

It is yet a further object of the present invention to provide a novel semiconductor device having a capacitor having an improved cylindrically shaped stacked electrode free from the above problems.

It is further more object of the present invention to provide a novel semiconductor device having a capacitor having an improved cylindrically shaped stacked electrode having a hemispherical grain surface being free of any holes which penetrate from an outer wall to an inner wall of the cylindrically shaped stacked electrode and having a high mechanical strength to prevent a capacitor from being broken.

It is moreover object of the present invention to provide a novel semiconductor device having a capacitor having an improved cylindrically shaped stacked electrode having a hemispherical grain surface being free of any crystal grains which penetrate from an outer wall to an inner wall of the cylindrically shaped stacked electrode and having a high mechanical strength to prevent a capacitor from being broken.

It is another object of the present invention to provide a novel method of forming a cylindrically shaped stacked electrode free from the above problems.

It is a further object of the present invention to provide a novel method of forming a cylindrically shaped stacked electrode having a hemispherical grain surface being free of any holes which penetrate from an outer wall to an inner wall of the cylindrically shaped stacked electrode and having a high mechanical strength to prevent a capacitor from being broken.

It is a still further object of the present invention to provide a novel method of forming a cylindrically shaped stacked electrode having a hemispherical grain surface being free of any crystal grains which penetrate from an outer wall to an inner wall of the cylindrically shaped stacked electrode and having a high mechanical strength to prevent a capacitor from being broken.

It is yet a further object of the present invention to provide a novel method of forming a semiconductor device having a capacitor having an improved cylindrically shaped stacked electrode free from the above problems.

It is further more object of the present invention to provide a novel method of forming a semiconductor device having a capacitor having an improved cylindrically shaped stacked electrode having a hemispherical grain surface being free of any holes which penetrate from an outer wall to an inner wall of the cylindrically shaped stacked electrode and having a high mechanical strength to prevent a capacitor from being broken.

It is moreover object of the present invention to provide a novel method of forming a semiconductor device having a capacitor having an improved cylindrically shaped stacked electrode having a hemispherical grain surface being free of any crystal grains which penetrate from an outer wall to an inner wall of the cylindrically shaped stacked electrode and having a high mechanical strength to prevent a capacitor from being broken.

The first present invention provides a cylindrically shaped stack electrode having a lamination structure which comprises a cylindrically shaped outer layer and a cylindrically shaped inner layer laminated on an inner wall of said cylindrically shaped outer layer, wherein hemispherical grains are formed on an inner wall of said cylindrically shaped inner layer.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

The first present invention provides a cylindrically shaped stack electrode having a lamination structure which comprises a cylindrically shaped outer layer and a cylindrically shaped inner layer laminated on an inner wall of said cylindrically shaped outer layer, wherein hemispherical grains are formed on an inner wall of said cylindrically shaped inner layer. The cylindrically shaped stack electrode has the lamination structure of a plurality of layers. There exist no crystal grains across the lamination structure. The hemispherical grains are grown from the inner wall of said cylindrically shaped inner layer. The cylindrically shaped outer layer serves as a stopper layer to the crystal grains, whereby there is no penetrating holes penetrating the cylindrically shaped stack electrode. The cylindrically shaped stack electrode has a high mechanical strength.

It is preferable to provide an additional stopper layer on an inner wall of the cylindrically shaped outer layer, wherein the additional stopper layer is effective to stop crystal grains from reaching the cylindrically shaped outer layer.

It is also preferable to provide an additional stopper layer between the cylindrically shaped outer layer and the cylindrically shaped inner layer, wherein the additional stopper layer is effective to stop crystal grains from reaching the cylindrically shaped outer layer.

It is preferable that the cylindrically shaped inner layer comprises an amorphous silicon layer with the inner wall having hemispherical grains, whilst the cylindrically shaped outer layer comprises a polysilicon layer.

The second present invention also provides a stacked capacitor which comprises a cylindrically shaped stack electrode, a capacitive insulation film and a surface side opposite electrode, wherein the cylindrically shaped stack electrode has a lamination structure which comprises a cylindrically shaped outer layer and a cylindrically shaped inner layer laminated on an inner wall of said cylindrically shaped outer layer, wherein hemispherical grains are formed on an inner wall of said cylindrically shaped inner layer. The cylindrically shaped stack electrode has the lamination structure of a plurality of layers. There exist no crystal grains across the lamination structure. The hemispherical grains are grown from the inner wall of said cylindrically shaped inner layer. The cylindrically shaped outer layer serves as a stopper layer to the crystal grains, whereby there is no penetrating holes penetrating the cylindrically shaped stack electrode. The cylindrically shaped stack electrode has a high mechanical strength.

It is preferable to provide an additional stopper layer on an inner wall of the cylindrically shaped outer layer, wherein the additional stopper layer is effective to stop crystal grains from reaching the cylindrically shaped outer layer.

It is also preferable to provide an additional stopper layer between the cylindrically shaped outer layer and the cylindrically shaped inner layer, wherein the additional stopper layer is effective to stop crystal grains from reaching the cylindrically shaped outer layer.

It is preferable that the cylindrically shaped inner layer comprises an amorphous silicon layer with the inner wall having hemispherical grains, whilst the cylindrically shaped outer layer comprises a polysilicon layer.

The third present invention also provides a method of forming a cylindrically shaped stack electrode having a lamination structure. The method comprises the steps of forming a cylindrically shaped outer layer, forming a cylindrically shaped inner layer laminated on an inner wall of the cylindrically shaped outer layer, and forming hemispherical grains on an inner wall of said cylindrically shaped inner layer. The cylindrically shaped stack electrode has the lamination structure of a plurality of layers. There exist no crystal grains across the lamination structure. The hemispherical grains are grown from the inner wall of said cylindrically shaped inner layer. The cylindrically shaped outer layer serves as a stopper layer to the crystal grains, whereby there is no penetrating holes penetrating the cylindrically shaped stack electrode. The cylindrically shaped stack electrode has a high mechanical strength.

It is preferable to form an additional stopper layer on an inner wall of the cylindrically shaped outer layer, wherein the additional stopper layer is effective to stop crystal grains from reaching the cylindrically shaped outer layer.

It is also preferable to form an additional stopper layer between the cylindrically shaped outer layer and the cylindrically shaped inner layer, wherein the additional stopper layer is effective to stop crystal grains from reaching the cylindrically shaped outer layer.

It is preferable that the cylindrically shaped inner layer comprises an amorphous silicon layer with the inner wall having hemispherical grains, whilst the cylindrically shaped outer layer comprises a polysilicon layer.

The fourth present invention also provides a method of forming a stacked capacitor. The method comprises the steps of forming a cylindrically shaped outer layer, forming a cylindrically shaped inner layer laminated on an inner wall of the cylindrically shaped outer layer, and forming hemispherical grains on an inner wall of the cylindrically shaped inner layer to form a cylindrically shaped stack electrode, forming a capacitive insulation film on a surface of the cylindrically shaped stack electrode, and forming a surface side opposite electrode on the capacitive insulation film. The cylindrically shaped stack electrode has the lamination structure of a plurality of layers. There exist no crystal grains across the lamination structure. The hemispherical grains are grown from the inner wall of said cylindrically shaped inner layer. The cylindrically shaped outer layer serves as a stopper layer to the crystal grains, whereby there is no penetrating holes penetrating the cylindrically shaped stack electrode. The cylindrically shaped stack electrode has a high mechanical strength.

It is preferable to form an additional stopper layer on an inner wall of the cylindrically shaped outer layer, wherein the additional stopper layer is effective to stop crystal grains from reaching the cylindrically shaped outer layer.

It is also preferable to form an additional stopper layer between the cylindrically shaped outer layer and the cylindrically shaped inner layer, wherein the additional stopper layer is effective to stop crystal grains from reaching the cylindrically shaped outer layer.

It is preferable that the cylindrically shaped inner layer comprises an amorphous silicon layer with the inner wall having hemispherical grains, whilst the cylindrically shaped outer layer comprises a polysilicon layer.

Preferred Embodiment

Figure 1:
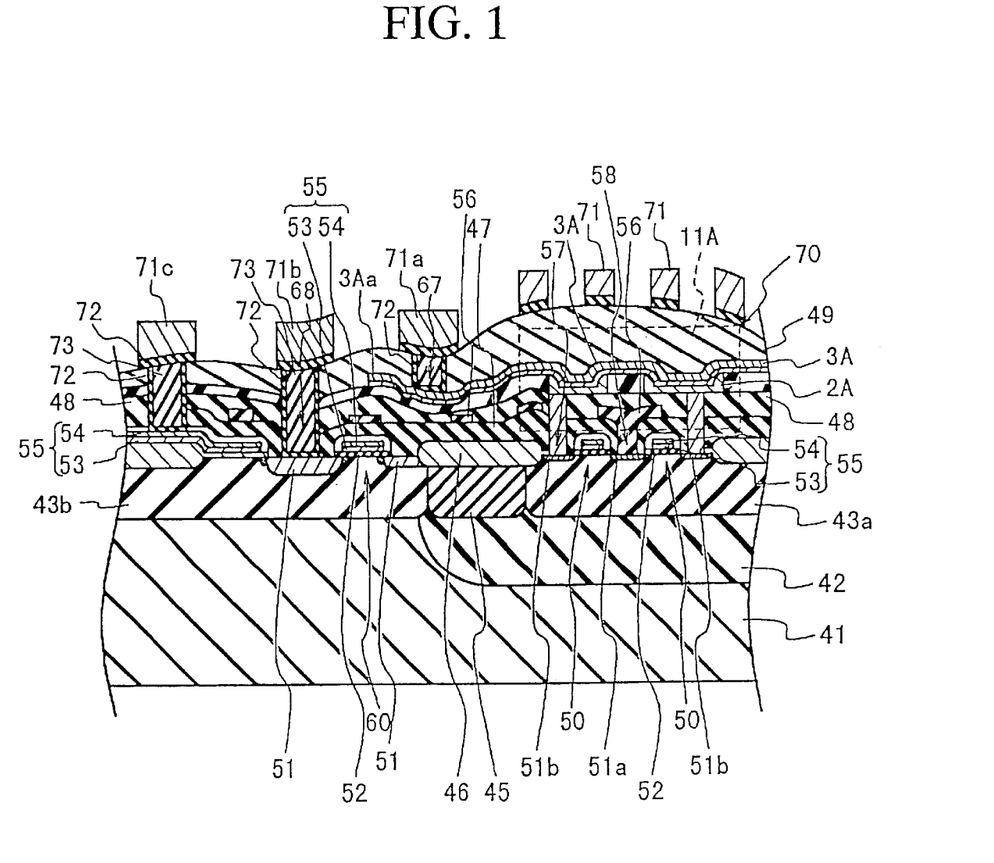
FIG. 1 is a fragmentary cross sectional elevation view illustrative of a DRAM having a novel stacked capacitor having an improved cylindrically shaped stack electrode in a first embodiment in accordance with the present invention.

A first embodiment according to the present invention will be described in detail with reference to the drawings. A novel cylindrically shaped stack capacitor is provided in a dynamic random access memory which will hereinafter referred to as DRAM. FIG. 1 is a fragmentary cross sectional elevation view illustrative of a DRAM having a novel stacked capacitor having an improved cylindrically shaped stack electrode in a first embodiment in accordance with the present invention. The DRAM has a p-type silicon substrate 41. An n-well 42 is selectively formed in an upper region of the p-type silicon substrate 41. A first p-well 43a is formed on a top surface of the n-well 42 except for peripheral region of the n-well 42. An n-type isolation region 45 is formed on the peripheral region of the n-well 42. A second p-well 43a is formed on a top surface of the p-type silicon substrate 41, free from the n-well 42. A field oxide film 46 is formed on the n-type isolation region 45. The first and second p-wells 43a and 43b are isolated from each other by laminations of the n-type isolation region 45 and the field oxide film 46. A top surface region of the first p-well 43a serves as a first active region on which a pair of memory cell transistors 50 are formed.

Each of the memory cell transistors 50 has a gate insulation film 52 on the top surface of the first active region and a gate electrode 55 on the gate insulation film 52, wherein the gate electrode 55 comprises laminations of a polysilicon film 53 and a silicide film 54. Each of the memory cell transistors 50 has source/drain regions 51a which are formed in selected upper regions of the first active region. The transistors 50 are covered by a first inter-layer insulator 47. The first inter-layer insulator 47 has a contact hole 58 which reach the source or drain region 51a commonly provided for the memory cell transistors 50.

A bit line 56 is connected through the contact hole 58 to first one of the source or drain regions 51a commonly provided for the memory cell transistors 50. The bit line 56 is covered by a second inter-layer insulator 48. A capacitor 70 is positioned over the second inter-layer insulator 48. A capacitor 70 comprises a capacitive bottom electrode 2A, a capacitive insulation film of tantalum oxide 11A and a capacitive top electrode 3A. A contact hole 57 is formed which penetrates through the first and second inter-layer insulators 47 and 48. The capacitive bottom electrode 2A is connected through the contact hole 57 to a second one of the source or drain regions 51a.

The top electrode 3A is formed commonly for the capacitive electrodes of the paired memory cells. The top electrode 3A has an extension part 3Aa for connection to an inter- connection positioned at a higher level than the top electrode 3A. The capacitor is covered by a third inter-layer insulator 49. A contact hole 67 is formed in the third inter-layer insulator 49 and over the extension part 3Aa of the top electrode 3A. A plurality of aluminum electrodes 71 is provided on the third inter-layer insulator 49. One aluminum electrode 71a of the plurality of aluminum electrodes 71 is connected through the contact hole 67 to the top electrode 3A. The aluminum electrode 71a has a fixed potential, for example, a ground potential. The contact hole 67 has a side wall and a bottom which are covered by a titanium nitride film 72 and the contact hole 67 is filled with a tungsten film 73.

The aluminum electrodes 71 have bottoms which are covered by the titanium nitride films 72. A transistor 60 is formed in the second p-well 43b, wherein the transistor 60 forms a part of a peripheral circuit for the memory. The transistor 60 has n-type source/drain regions 51 formed in upper regions of the second p-well 43b, a gate insulation film 52 on a top surface of the second p-well 43b, and a gate electrode 55 on the gate insulation film 52, wherein the gate electrode 55 has laminations of a polysilicon film 53 and a silicide layer 54.

A contact hole 68 is provided which penetrates through the first, second and third inter-layer insulators 47, 48 and 49. One of the source/drain regions 51 of the transistor 60 is connected through the contact hole 68 to an aluminum electrode 71b having a bottom covered with the titanium nitride film. The contact hole 68 has a side wall and a bottom which are covered with a titanium nitride film 72. The contact hole 68 is filled with a tungsten film 73. A contact hole 73 is provided which penetrates through the first, second and third inter-layer insulators 47, 48 and 49. An adjacent transistor to the transistor 60 has a gate electrode 55 which is connected through the contact hole 73 to an aluminum electrode 71c on the third inter-layer insulator 49.

FIGS. 2A through 2E are fragmentary cross sectional elevation views illustrative of sequential steps involved in a method of forming a novel stacked capacitor having an improved cylindrically shaped stack electrode in a DRAM of FIG. 1.

Figure 2A:
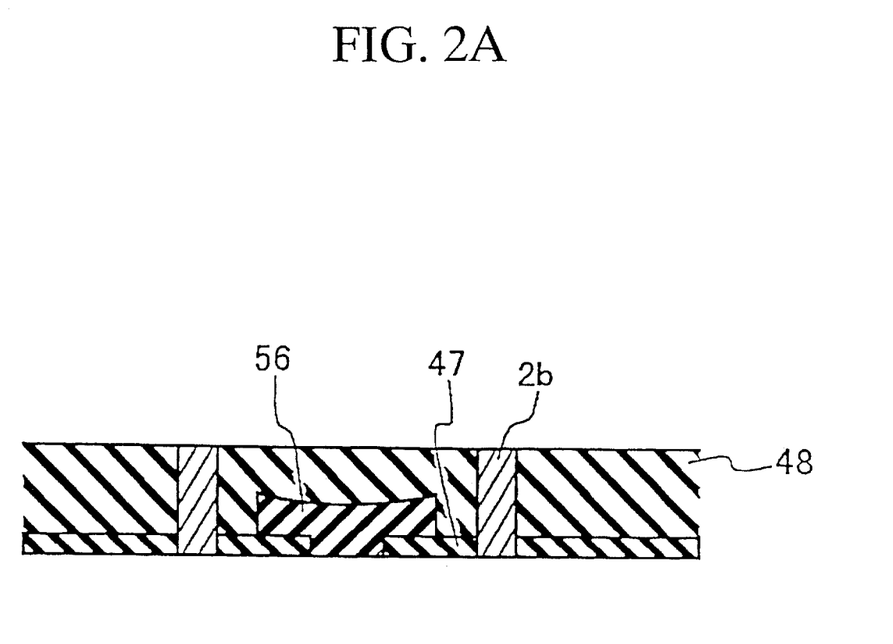
FIGS. 2A through 2E are fragmentary cross sectional elevation views illustrative of sequential steps involved in a method of forming a novel stacked capacitor having an improved cylindrically shaped stack electrode in a DRAM of FIG. 1.

With reference to FIG. 2A, capacitive contact holes are formed in an inter-layer insulator 48. The capacitive contact holes are filled with a contact material phosphorus doped polysilicon or metal films such as tungsten. An etch back is carried out to have the contact material remain only within the capacitive contact holes to form capacitive contact plugs 2b.

Figure 2B:
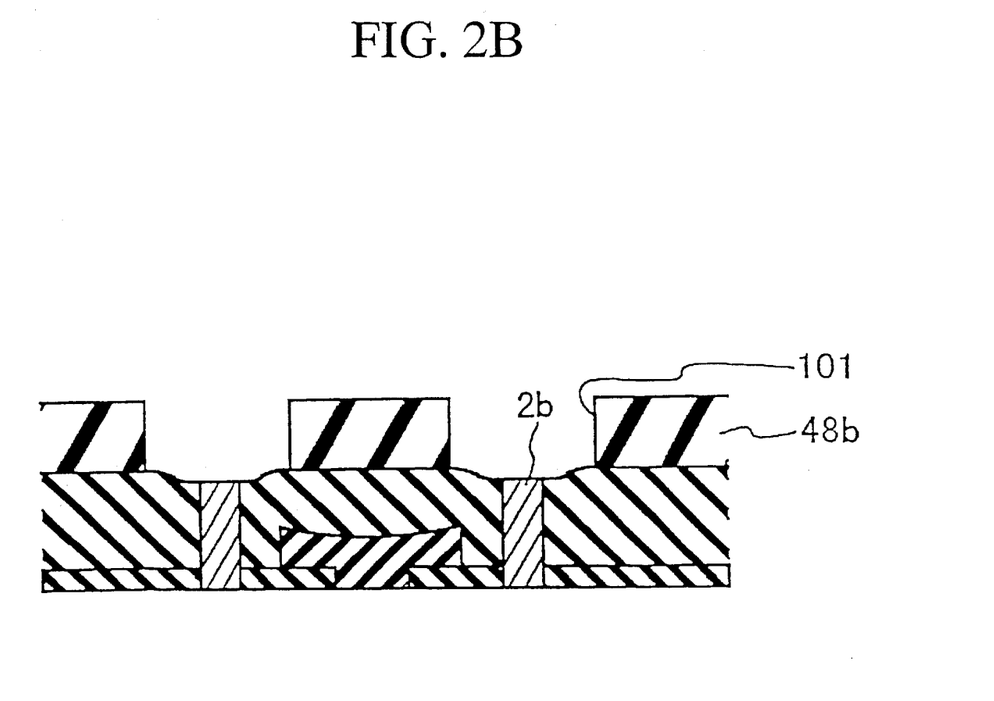

With reference to FIG. 2B, an inter-layer insulator 48b is formed on a top surface of the inter-layer insulator 48. Holes 101 are formed in the inter-layer insulator 48b so that the holes 101 are positioned over the capacitive contact plugs 2b and peripheral regions thereof.

Figure 2C:
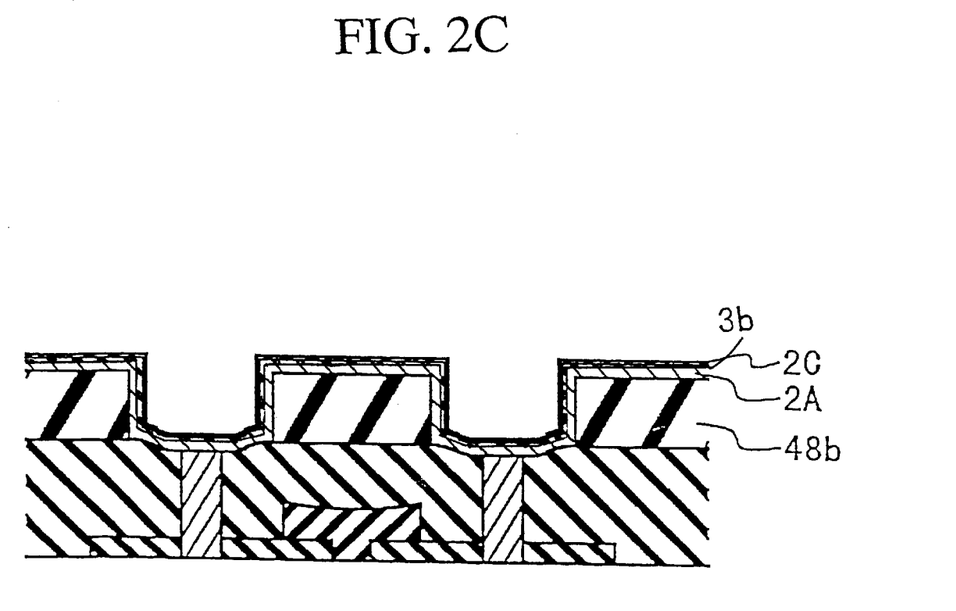

With reference to FIG. 2C, a polysilicon film 2A is entirely formed on the bottoms and side walls of the holes 101 and on the top surface of the inter-layer insulator 48. The polysilicon film 2A may be formed by crystallization of a phosphorus-doped amorphous silicon film or by introducing an impurity into an undoped polysilicon film by either an impurity diffusion or an ion-implantation. An intermediate oxide film 3b having a thickness of about 10 angstroms and serving as a stopper layer is formed on the surface of the polysilicon film 2A, wherein $HCl+H_2O_2$ solution is used. A phosphorus doped amorphous silicon inner layer 2C is formed on the polysilicon film 2A to form a lamination structure.

Figure 2D:
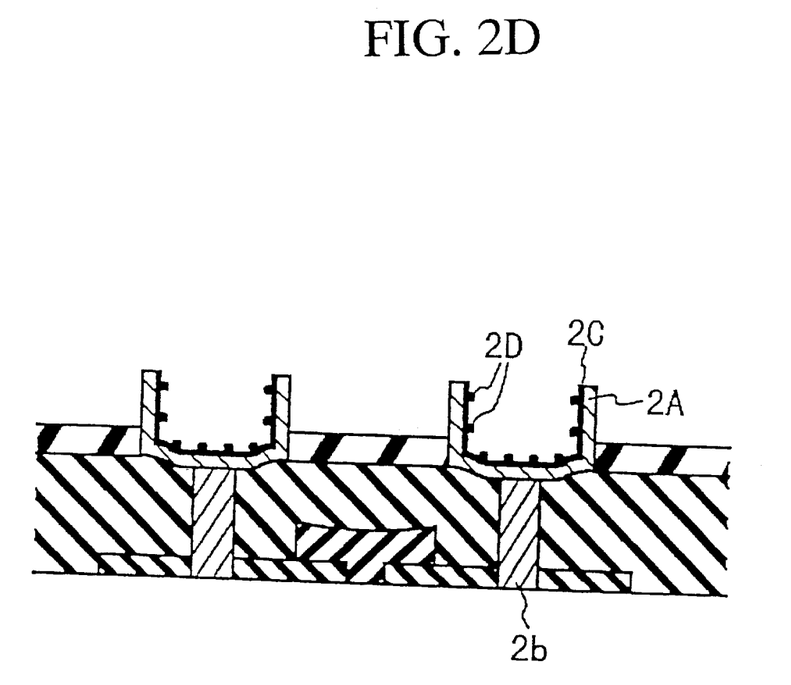

With reference to FIG. 2D, an oxide film is formed on the phosphorus doped amorphous silicon inner layer 2C so that the oxide film fills the hole 101. An etch back is carried out to remove parts of the laminations of the polysilicon film 2A and the phosphorus doped amorphous silicon inner layer 2C over the inter-layer insulator 48b, whereby the lamination structure cylindrically shaped is formed within the hole 101 formed in the inter-layer insulator 48b. Hemispherical grains 2D are formed on the inner layer 2C, whereby a cylindrically shaped stack electrode is formed which has a lamination structure which comprises the polysilicon outer layer 2A and the inner layer 2C having the hemispherical grain surface 2D. The inter-layer insulator 48b is partially removed by a wet etching, so that a part of the cylindrically shaped stack electrode is projected from the surface of the remaining part of the inter-layer insulator 48b.

Figure 2E:
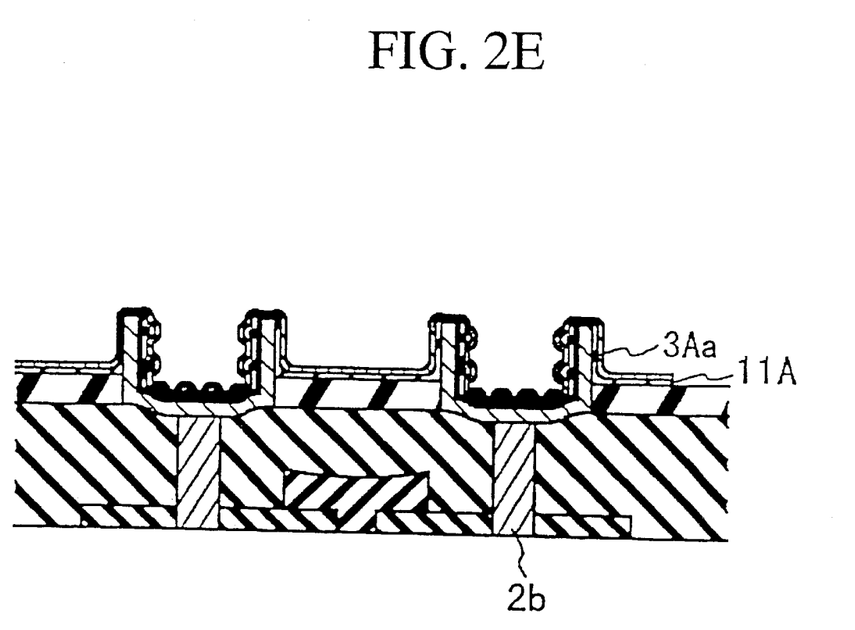

With reference to FIG. 2E, a low pressure chemical vapor deposition method is carried out by use of source gases of $Ta(OC_2H_5)_5$ and $O_2$ to entirely deposit a $Ta_2O_5$ capacitive insulation film 11A. A heat treatment is carried out at 800° C. with an oxygen gas to oxidize the $Ta_2O_5$ capacitive insulation film 11A. A chemical vapor deposition is carried out by use of source gases of $TiCl_4$ and $NH_3$ to deposit a TiN electrode 3Aa.

The above processes may be carried out as follows.

After a polysilicon film 2A is formed, a phosphorus diffusion or an ion-implantation is carried out to introduce the impurity into the polysilicon film 2A. In this case, a natural oxide film on the surface of the polysilicon film 2A is removed before silicon on a surface of the polysilicon film 2A is terminated with hydrogen. In a growth chamber used for growing a phosphorus doped amorphous silicon, hydrogen is eliminated from silicon on the surface of the polysilicon film 2A before oxygen atoms are absorbed by Langmuir's absorption on a surface of the polysilicon film 2A.

A phosphorus doped amorphous silicon inner layer 2C is formed on the surface of the polysilicon outer film 2A. The hole 101 is filled with an oxide film. An etch back is carried out to leave the laminations of the polysilicon film 2A and the phosphorus doped amorphous silicon inner layer 2C only within the hole 101. Hemispherical grains 2D are formed on the surface of the inner layer 2C, whereby a cylindrically shaped stack electrode is formed which has a lamination structure which comprises the polysilicon outer layer 2A and the inner layer 2C having the hemispherical grain surface 2D. The inter-layer insulator 48b is partially removed by a wet etching, so that a part of the cylindrically shaped stack electrode is projected from the surface of the remaining part of the inter-layer insulator 48b.

A low pressure chemical vapor deposition method is carried out by use of source gases of $Ta(OC_2H_5)_5$ and $O_2$ to entirely deposit a $Ta_2O_5$ capacitive insulation film 11A. A heat treatment is carried out at 800° C. with an oxygen gas to oxidize the $Ta_2O_5$ capacitive insulation film 11A. A chemical vapor deposition is carried out by use of source gases of $TiCl_4$ and $NH_3$ to deposit a TiN electrode 3Aa.

Figure 3:
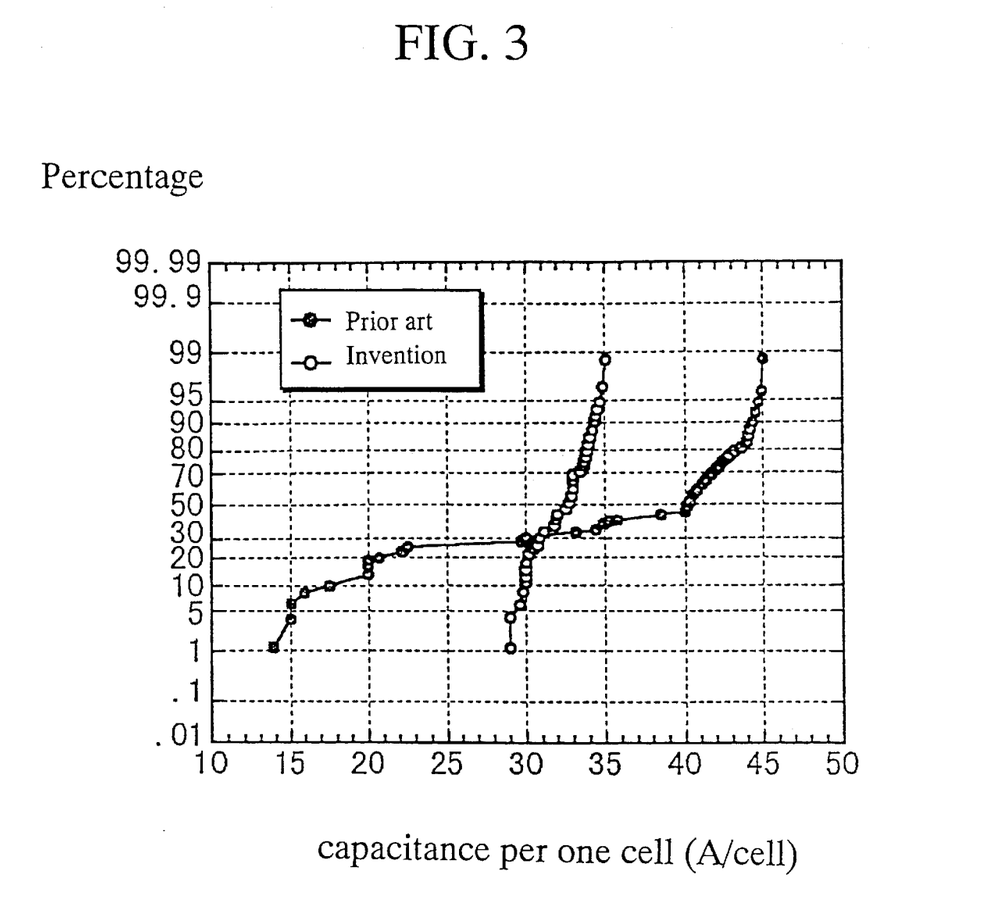
FIG. 3 is a diagram illustrative of distribution in plane of capacitance values of cylindrically shaped capacitor with hemispherical grain surface of each of the conventional electrode and the novel electrode in accordance with the present invention.
Figure 4A:
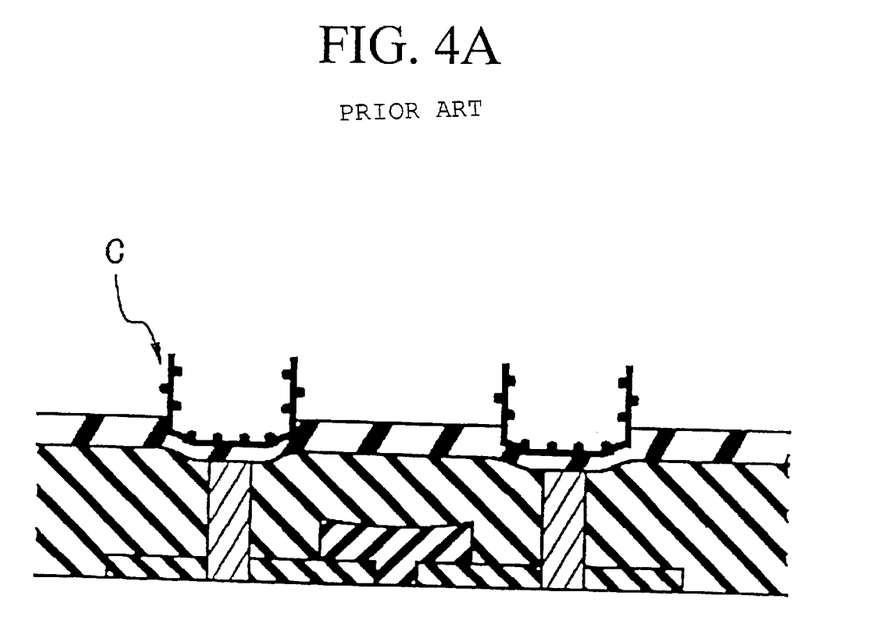
FIG. 4A is a fragmentary cross sectional elevation view illustrative of a conventional cylindrically shaped stack electrode with a hemispherical grain surface.
Figure 4B:
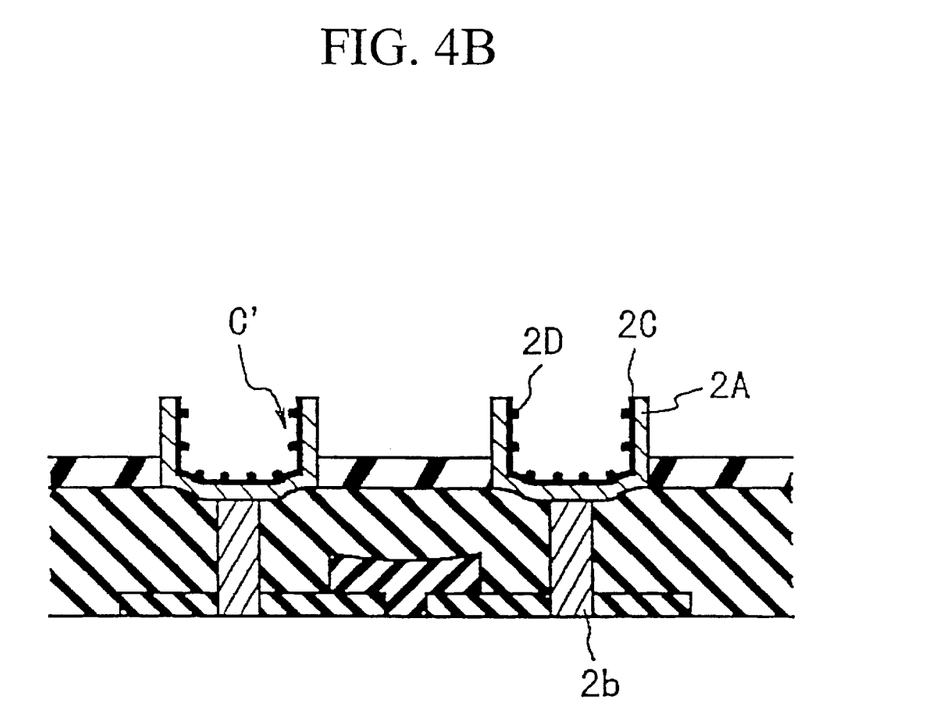
FIG. 4B is a fragmentary cross sectional elevation view illustrative of a novel cylindrically shaped stack electrode with a hemispherical grain surface in accordance with the present invention.

FIG. 3 is a diagram illustrative of distribution in plane of capacitance values of cylindrically shaped capacitor with hemispherical grain surface of each of the conventional electrode and the novel electrode in accordance with the present invention. FIG. 4A is a fragmentary cross sectional elevation view illustrative of a conventional cylindrically shaped stack electrode with a hemispherical grain surface. Some of crystal grains C penetrate through the conventional cylindrically shaped stack electrode. FIG. 4B is a fragmentary cross sectional elevation view illustrative of a novel cylindrically shaped stack electrode with a hemispherical grain surface in accordance with the present invention. All of the crystal grains C' exist on the inner layer 2C but do not reach the outer layer 2A.

On a measurement pattern, 10000 of the stacked capacitors are formed, wherein 1/10000 of a measured capacitance value corresponds to an individual capacitance of a single capacitor. Since the conventional capacitor has hemispherical grains on both surfaces of the cylindrically shaped stack electrode, a maximum capacitance value is larger than that of the novel capacitor of the present invention. However, some of the conventional capacitor are broken and a minimum capacitance value is smaller than that of the novel capacitor of the present invention.

The novel cylindrically shaped stack electrode has no penetrating hole nor penetrating crystal grains, for which reason the novel cylindrically shaped stack electrode has a high mechanical strength and has no damage. The capacitance distribution in wafer plane of the novel cylindrically shaped stack electrode is smaller than the conventional cylindrically shaped stack electrode.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A cylindrically shaped stack electrode comprising:
    a cylindrically shaped outer layer having a non-planar bottom surface adjacent to a via and having a part projecting from a surface of an interlayer insulator;
    a cylindrically shaped inner layer laminated on an inner wall of said cylindrically shaped outer layer, an outer wall of said outer layer being exposed; and
    hemispherical grains formed only on an inner wall of said cylindrically shaped inner layer.

2. The cylindrically shaped stack electrode as claimed in claim 1, further comprising an additional stopper layer on an inner wall of the cylindrically shaped outer layer, wherein the additional stopper layer is effective to stop crystal grains from reaching the cylindrically shaped outer layer.

3. The cylindrically shaped stack electrode as claimed in claim 1, further comprising an additional stopper layer between the cylindrically shaped outer layer and the cylindrically shaped inner layer, wherein the additional stopper layer is effective to stop crystal grains from reaching the cylindrically shaped outer layer.

4. The cylindrically shaped stack electrode as claimed in claim 1, wherein the cylindrically shaped inner layer comprises an amorphous silicon layer with the inner wall having hemispherical grains, whilst the cylindrically shaped outer layer comprises a polysilicon layer.

5. A stacked capacitor comprising:
    a cylindrically shaped stack electrode;
    a surface side opposite electrode; and
    a capacitive insulation film between said stack electrode and said opposite electrode,
    wherein the cylindrically shaped stack electrode has an outer layer, having a non-planar bottom surface adjacent to a via and having a part projecting from a surface of an interlayer insulator and a cylindrically shaped inner layer laminated on an inner wall of said cylindrically shaped outer layer, an outer wall of said cylindrically shaped outer layer contacting said capacitive insulation film and wherein hemispherical grains are formed only on an inner wall of said cylindrically shaped inner layer.

6. The stacked capacitor as claimed in claim 5, further comprising an additional stopper layer on an inner wall of the cylindrically shaped outer layer, wherein the additional stopper layer is effective to stop crystal grains from reaching the cylindrically shaped outer layer.

7. The stacked capacitor as claimed in claim 5, further comprising an additional stopper layer between the cylindrically shaped outer layer and the cylindrically shaped inner layer, wherein the additional stopper layer is effective to stop crystal grains from reaching the cylindrically shaped outer layer.

8. The stacked capacitor as claimed in claim 5, wherein the cylindrically shaped inner layer comprises an amorphous silicon layer with the inner wall having hemispherical grains, whilst the cylindrically shaped outer layer comprises a polysilicon layer.

9. A stacked capacitor assembly comprising:

first and second adjacent cylindrically shaped stack electrodes;

hemispherical grains arranged on the stack electrodes;

a surface side opposite electrode on said first and second stack electrodes; and a capacitive insulation film between said first and second stack electrodes and said opposite electrode, each said first and second stack electrode having a cylindrically shaped outer layer, having a part projecting from a surface of an interlayer insulator and a cylindrically shaped inner layer laminated on an inner wall of said cylindrically shaped outer layer, an outer wall of said cylindrically shaped outer layer contacting said capacitive insulation film, wherein between said first and second stack electrodes, said opposite electrode has first and second portions on respective said parts of the first and second stack electrodes projecting from said surface of said interlayer insulator and a third portion extending between said first and second portions, outer surfaces of the respective first and second portions between the first and second stack electrodes facing one another, and wherein the hemispherical grains are arranged on the stack electrodes only on an inner wall of said cylindrically shaped inner layer.

10. The stacked capacitor as claimed in claim 9, wherein the opposite electrode and the capacitive insulation film are shaped to follow a contour of said hemispherical grains.

* * * * *